(12) United States Patent
Boemler (10) Patent No.: US 11,653,112 B2
(45) Date of Patent: May 16, 2023

(54) ANALOG VOTING WITH OUTLIER SUPPRESSION

(71) Applicant: Raytheon Company, Waltham, MA (US)

(72) Inventor: Christian M. Boemler, Waltham, MA (US)

(73) Assignee: Raytheon Company, Waltham, MA (US)

( * ) Notice: Subject to any disclaimer, the term of this patent is extended or adjusted under 35 U.S.C. 154(b) by 156 days.

(21) Appl. No.: 17/101,628

(22) Filed: Nov. 23, 2020

(65) Prior Publication Data

US 2022/0166945 A1    May 26, 2022

(51) Int. Cl.
*H04N 25/60* (2023.01)
*H03M 1/08* (2006.01)
*H03M 1/12* (2006.01)
*H04N 25/75* (2023.01)

(52) U.S. Cl.
CPC ........... *H04N 25/60* (2023.01); *H03M 1/08* (2013.01); *H03M 1/12* (2013.01); *H04N 25/75* (2023.01)

(58) Field of Classification Search
CPC ........ H04N 5/357; H04N 5/378; H04N 5/361; H04N 5/2176; H04N 5/36963; H03M 1/08; H03M 1/12
USPC ......................................................... 348/294
See application file for complete search history.

(56) References Cited

U.S. PATENT DOCUMENTS

| 6,829,007 B1 | 12/2004 | Bilhan et al. |
| 8,106,975 B2 | 1/2012 | Yin |
| 8,508,629 B2 | 8/2013 | Mo et al. |
| 2009/0273691 A1 | 11/2009 | Mo et al. |
| 2013/0120619 A1* | 5/2013 | Mo .................. H04N 25/63 348/243 |
| 2014/0027611 A1 | 1/2014 | Patel |
| 2017/0295330 A1 | 10/2017 | Han |

(Continued)

FOREIGN PATENT DOCUMENTS

CN    111491118 A    8/2020

OTHER PUBLICATIONS

PCT International Search Report dated Feb. 2, 2022, issued during the prosecution of PCT International Patent Application No. PCT/US2021/060455.

*Primary Examiner* — Lin Ye
*Assistant Examiner* — Chan T Nguyen
(74) *Attorney, Agent, or Firm* — Locke Lord LLP; Joshua L. Jones; Scott D. Wofsy (57) ABSTRACT

A method including collecting analog image data from an imaging array wherein the analog image data includes analog image data from a plurality of imaging pixels and from a plurality of opaque pixels. Each row of the imaging array includes both imaging pixels and opaque pixels. Opaque subtraction is performed in an analog domain, wherein biases determined in the opaque pixels for a given row of the imaging array are subtracted from the analog image data of the imaging pixels of that given row for each row of the imaging array. Performing opaque subtraction includes suppressing outliers in the analog image data from the plurality of opaque pixels. The method includes performing analog to digital conversion (ADC) on the analog image data to produce digital image data for the imaging pixels. ADC is performed after opaque subtraction in the analog domain.

11 Claims, 5 Drawing Sheets

(56) References Cited

U.S. PATENT DOCUMENTS

2019/0149577 A1* 5/2019 Kelly .................... H04L 9/0819
　　　　　　　　　　　　　　　　　　　　　　713/168
2019/0149755 A1* 5/2019 Yasuma ............. H04N 5/36963
　　　　　　　　　　　　　　　　　　　　　　348/245

* cited by examiner

ANALOG VOTING WITH OUTLIER SUPPRESSION

BACKGROUND

1. Field

The present disclosure relates to imaging, and more particularly to digital imaging with row and/or column noise reduction.

2. Description of Related Art

Figure 1:
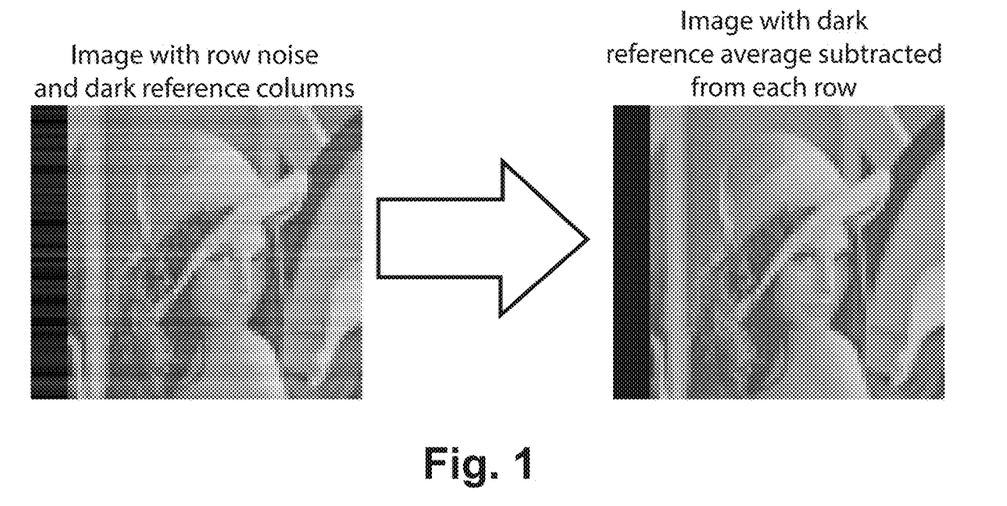
FIG. 1 is diagram showing a "Lenna" image, widely used in image processing community and papers, wherein the image has row noise, and showing the image with the dark references subtracted.

Read out integrated circuits (ROIC's) and image sensors (such as a focal plane array or FPA) commonly suffer from row noise, as shown in FIG. 1 at the left. Row noise is caused by slight biasing/supply differences from one row to the next, causing a common offset on all pixels in that row. As the ROIC samples the image row-by-row into a column sampling capacitor, this noise affects all pixels in that row. Such structured noise (along rows or columns) in an image are much more discernable to the human eye than unstructured (random) noise, and are thus esthetically unpleasing, than more randomly distributed forms of noise.

Figure 2:
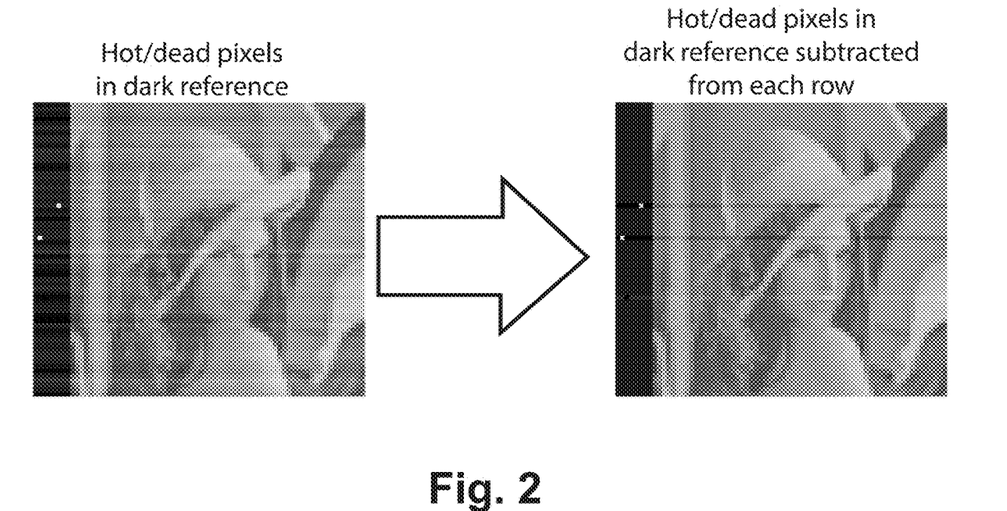
FIG. 2 is a diagram of the image of FIG. 1 in the case of hot and/or dead pixels in the dark reference, and showing the image that results in subtracting the dark references when hot and/or dead pixels are present in the dark references.

One traditional way to address the kind of row noise shown in FIG. 1 is to add extra opaque columns to the FPA. These columns are subjected to the same row noise offset as the "live" pixels. Since the opaque pixels have no image response, the value can be used to subtract from the "live" pixels. Opaque pixels are typically averaged to avoid opaque pixel noise from creating row noise by itself as it is being subtracted from the "live" image. While this can be an improvement over the image with unmitigated row noise, as shown in FIG. 1 at the right, the approach is still problematic when there are dead pixels, hot pixels, and/or blinking response in the opaque pixels themselves, as shown in FIG. 2 at the left. These result in stripes across the image, as shown in FIG. 2 at the right, and may be severe enough to reject the ROIC/FPA in quality control. Otherwise, the stripes can be mitigated with analog to digital conversion (ADC). But ADC noise reduction is known to introduce its own noise, can reduce dynamic range, and can consume considerable power.

The conventional techniques have been considered satisfactory for their intended purpose. However, there is an ever present need for improved systems and methods for imaging and noise reduction. This disclosure provides a solution for this need.

SUMMARY

A system includes a pixel array including a sub array of imaging pixels and a sub-array of opaque pixels. An analog voting component is operatively connected to the sub-array of opaque pixels to receive analog image data from the sub-array of opaque pixels. A filtering component is operatively connected to the sub-array of imaging pixels to receive analog image data from the sub-array of imaging pixels. The filtering component is operatively connected to the analog voting component for subtracting row averages from the sub-array of opaque pixels to reduce row noise in analog image data from the sub-array of imaging pixels. The analog voting component is configured to suppress outliers in the row averages from the sub-array of the opaque pixels.

The analog voting component can include a respective operational transconductance amplifier (OTA) connected to each respective column of the sub-array of opaque pixels. Outputs of each of the OTAs can be shorted together to output row averages with outliers suppressed to the filtering component. An analog to digital conversion (ADC) component can be operatively connected to receive analog image data from the filtering component for conversion into digital image data. The ADC component can reside in a read out only integrated circuit (ROIC). The pixel array, analog voting component, and the filtering component can all reside in a focal plane array (FPA).

A method includes collecting analog image data from an imaging array wherein the analog image data includes analog image data from a plurality of imaging pixels and from a plurality of opaque pixels. Each row of the imaging array includes both imaging pixels and opaque pixels. Opaque subtraction is performed in an analog domain, wherein biases determined in the opaque pixels for a given row of the imaging array are subtracted from the analog image data of the imaging pixels of that given row for each row of the imaging array. Performing opaque subtraction includes suppressing outliers in the analog image data from the plurality of opaque pixels. The method includes performing analog to digital conversion (ADC) on the analog image data to produce digital image data for the imaging pixels. ADC is performed after opaque subtraction in the analog domain.

Suppressing outliers can include clipping the analog image data from the plurality of opaque pixels prior to performing opaque subtraction to reduce impact on the digital image data of outliers in the opaque pixels. Clipping the analog image data from the plurality of opaque pixels can include using an operational transconductance amplifier (OTA) on the analog voltage data from the plurality of opaque pixels. Output current of the OTA can be governed by $$I_{out} \approx \min(I_{LIM}, \max(-I_{LIM}, G_m*(V_P-V_N)))$$

where $I_{out}$ is output current of the OTA, $I_{LIM}$ is limiting current for clipping outliers, $G_m$ is gain of the OTA, $V_P-V_n$ is differential input voltage of the OTA. The limiting current for clipping outliers can be governed by $$I_{LIM} \approx I_{bias} N * S_{105}/S_{104},$$

wherein $I_{out}$ is the limiting current for clipping outliers, $I_{bias} N$ is tail current of the OTA, and $S_{105}/S_{104}$ is current mirror gain of the OTA. Suppressing outliers in the analog image data from the plurality of opaque pixels can include suppressing analog image data from at least one of a dead pixel, a hot pixel, and/or a pixel with blinking response.

Collecting analog image data can include feeding the analog image data from the plurality of opaque pixels on a column by column basis wherein the analog image data from each column of the opaque pixels is fed to a respective OTA, wherein there is one OTA per column of opaque pixels. Each OTA can have a respective output, wherein suppressing outliers includes shorting the OTA outputs together to average analog image data for rows of the opaque pixels, wherein outliers are suppressed by current limiting in the OTAs.

The method can include using average analog image data for the rows, with outliers suppressed, to reduce row noise in the analog image data from the plurality of imaging pixels to create analog image data with reduced row noise. Performing ADC can include converting the analog image data with reduced row noise into digital image data. The method can include outputting the digital image data to at least one of a visual display, a hard copy, and/or a tangible storage medium.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 3:
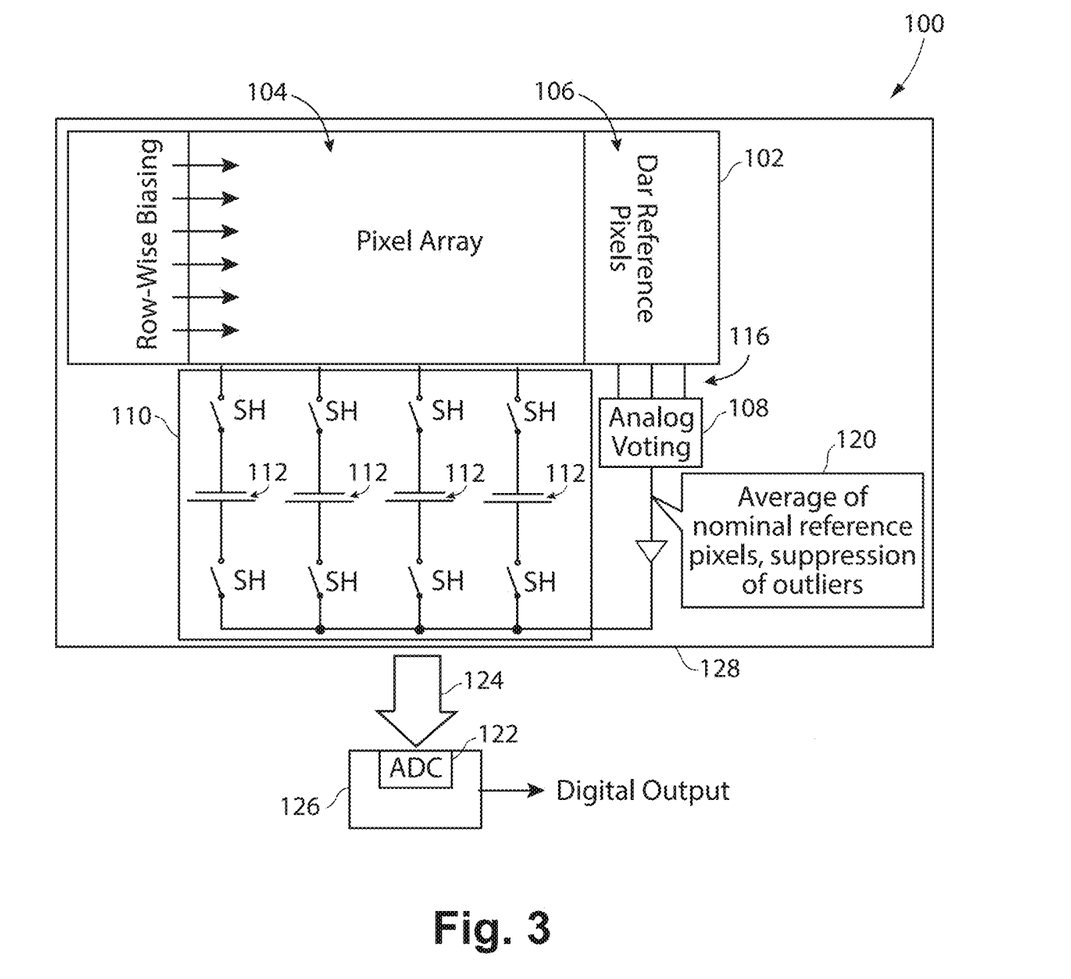
FIG. 3 is a schematic view of an embodiment of a system constructed in accordance with the present disclosure, showing the pixel array and analog voting component.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 3 and is designated generally by reference character 100. Other embodiments of systems in accordance with the disclosure, or aspects thereof, are provided in FIGS. 4-7, as will be described. The systems and methods described herein can be used to reduce row noise in digital imaging devices, e.g. without digital processing overhead as in traditional systems.

The system 100 includes a pixel array 102 including a sub array of imaging pixels 104 and a sub-array of opaque pixels 106. An analog voting component 108 is operatively connected to the sub-array of opaque pixels 106 to receive analog image data from the sub-array of opaque pixels 106. A filtering component 110 is operatively connected to the sub-array of imaging pixels 104 to receive analog image data from the sub-array of imaging pixels 104, e.g. using row by row sampling capacitors 112. The filtering component 110 is operatively connected to the analog voting component 108 for subtracting row averages from the sub-array of opaque pixels 106 to reduce row noise in analog image data from the sub-array of imaging pixels 104. The analog voting component 108 is configured to suppress outliers in the row averages from the sub-array of the opaque pixels 106 before subtracting the row averages from the sub-array of opaque pixels 106.

Figure 4:
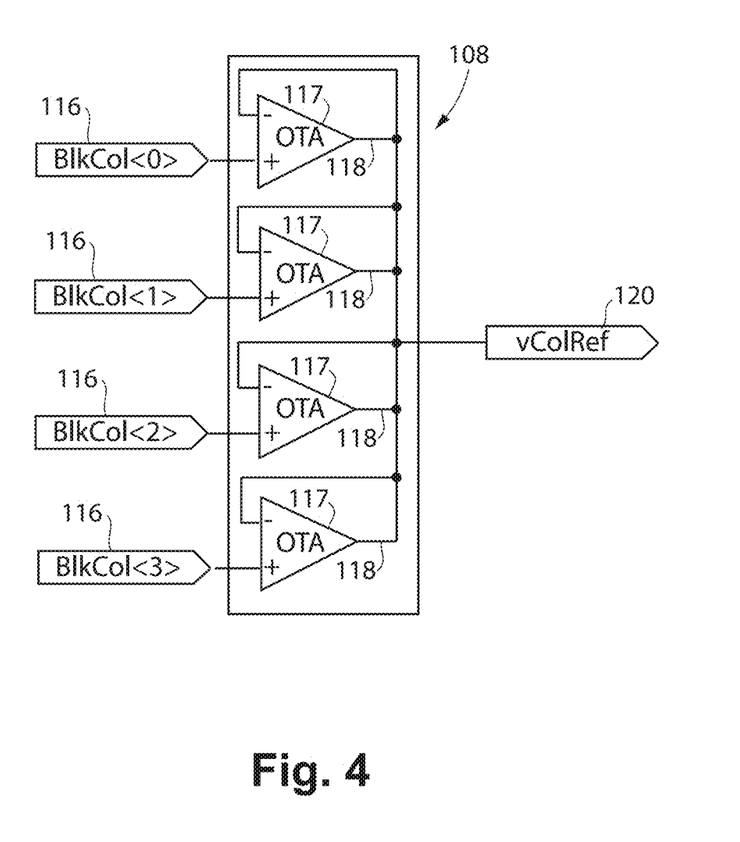
FIG. 4 is a schematic view of the voting component of FIG. 1, showing the operational transconductance amplifiers (OTAs)
Figure 5:
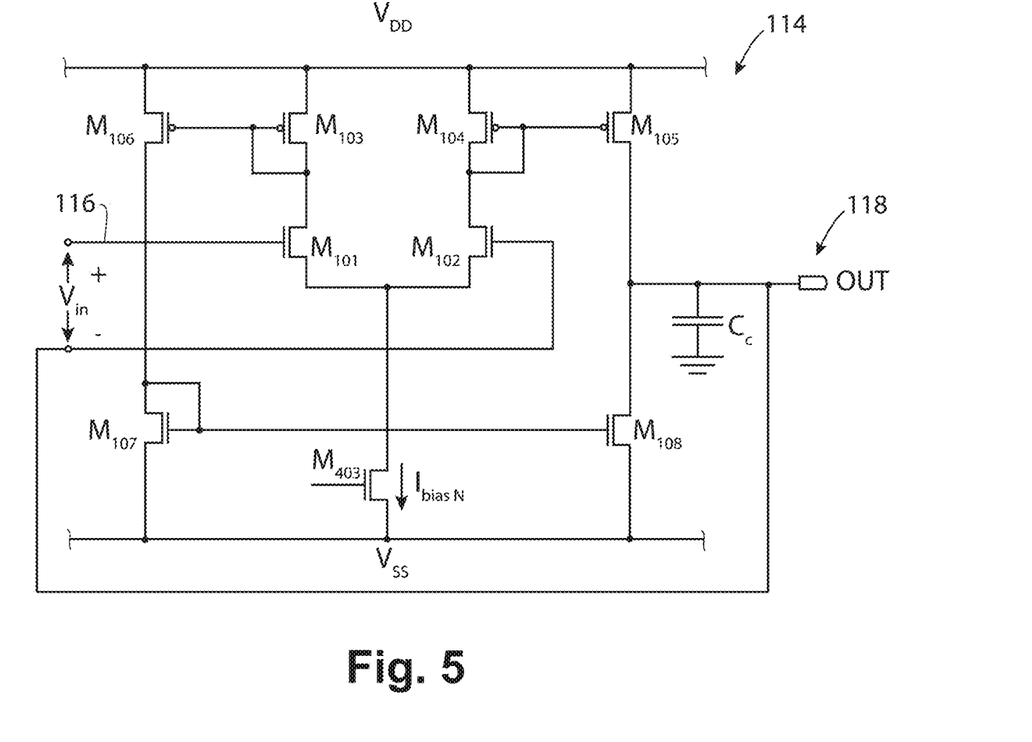
FIG. 5 is a schematic view of one of the OTAs of FIG. 4.

The analog voting component 108 includes a respective operational transconductance amplifier (OTA) 114 connected by a respective OTA input 116 to each respective column of the sub-array of opaque pixels 106 of FIG. 3. Outputs 118 of each of the OTAs are shorted together to a single output 120 of the analog voting component 108 to output row averages with outliers suppressed to the filtering component 110 of FIG. 3. FIG. 5 shows an example of an OTA schematic for uses as the OTAs 114. Any other suitable OTA architecture can be used. While FIGS. 1 and 2 show schematics for four rows and columns, those skilled in the art will readily appreciate that this is for sake of clarity and that any suitable number of columns/rows can be used in the sub-arrays 104, 106.

With reference again to FIG. 3, an analog to digital conversion (ADC) component 122 is operatively connected to receive analog image data 124 from the filtering component 110 for conversion into digital image data. The ADC component 122 resides in a read out only integrated circuit (ROIC) 126. The pixel array 102, analog voting component 108, and the filtering component 110 all reside in a focal plane array (FPA) 128.

A method includes collecting analog image data from an imaging array wherein the analog image data includes analog image data from a plurality of imaging pixels, e.g. from the sub-array of imaging pixels 104, and from a plurality of opaque pixels, e.g. from the sub-array of opaque pixels 106. Each row of the imaging array 102 includes both imaging pixels and opaque pixels. Opaque subtraction is performed in an analog domain, wherein biases determined in the opaque pixels for a given row of the imaging array 102 are subtracted from the analog image data of the imaging pixels of that given row for each row of the imaging array 102. Performing opaque subtraction includes suppressing outliers in the analog image data from the plurality of opaque pixels. The method includes performing analog to digital conversion (ADC) on the analog image data to produce digital image data for the imaging pixels. ADC is performed after opaque subtraction in the analog domain.

Figure 6:
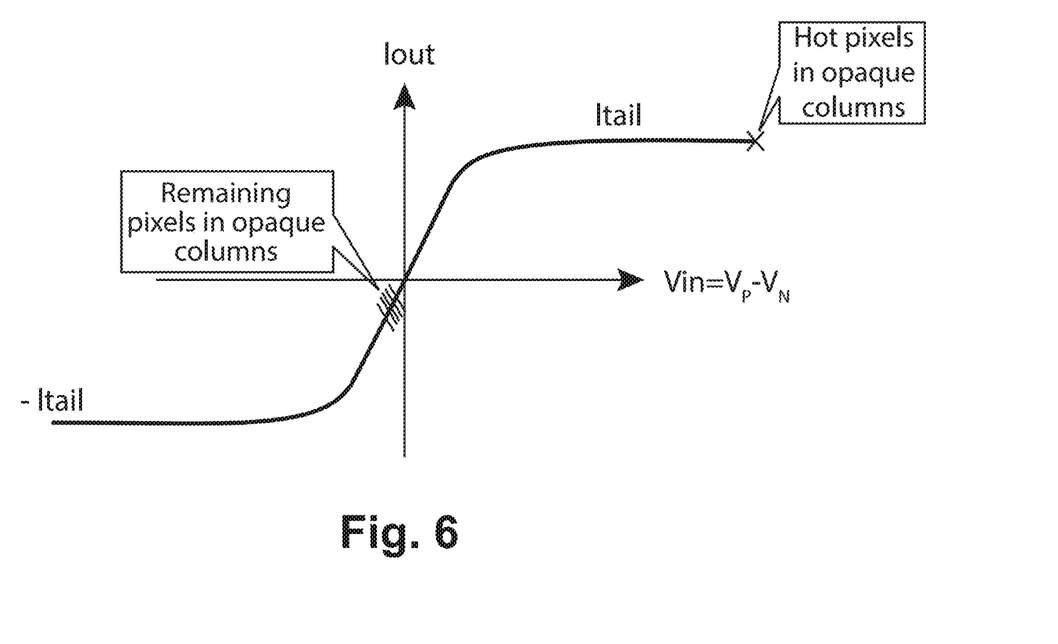
FIG. 6 is a graph schematically showing the clipping effect for suppressing a hot pixel using an OTA as in FIG. 4.

With reference to FIG. 6, suppressing outliers includes clipping the analog image data from the plurality of opaque pixels prior to performing opaque subtraction to reduce impact on the digital image data of outliers in the opaque pixels. Clipping the analog image data from the plurality of opaque pixels includes using an OTA 114, as shown in FIGS. 4-5 on the analog voltage data from the plurality of opaque pixels. Output current of the OTA 114 is governed by $$I_{out} = \min(I_{LIM}, \max(-I_{LIM}, G_m^*(V_P - V_N))$$

where $I_{out}$ is output current of the OTA, $I_{LIM}$ is limiting current for clipping outliers, $G_m$ is gain of the OTA, $V_P - V_n$ is differential input voltage of the OTA. The limiting current for clipping outliers is governed by $$I_{LIM} = I_{bias} N^* S_{105}/S_{104},$$

wherein $I_{LIM}$ is the limiting current for clipping outliers, $I_{bias} N$ is tail current of the OTA, and $S_{105}/S_{104}$ is current mirror gain of the OTA. Suppressing outliers in the analog image data from the plurality of opaque pixels includes suppressing analog image data from at least one of a dead pixel, a hot pixel, and/or a pixel with blinking response. As shown in FIG. 6, a hot pixel is clipped has its current clipped in the OTA 114 of FIG. 4 to not exceed $I_{tail}$, whereas the remaining, normal pixels are not clipped and so have current values between $-I_{tail}$ and $I_{tail}$.

With reference again to FIG. 4, collecting analog image data includes feeding the analog image data from the plurality of opaque pixels on a column by column basis wherein the analog image data from each column of the opaque pixels is fed through a respective input 116 to a respective OTA 114, wherein there is one OTA 114 per column of opaque pixels. Suppressing outliers includes shorting the OTA outputs 118 together to average analog image data for rows of the opaque pixels, wherein outliers are suppressed by current limiting in the OTAs.

With reference to FIG. 3, the method includes using average analog image data for the rows, with outliers suppressed, to reduce row noise in the analog image data from the plurality of imaging pixels in the filter component 110 to create analog image data with reduced row noise. Performing ADC includes converting the analog image data with reduced row noise from the filter component 110 into digital image data using the ADC component 122. The method can include outputting the digital image data to at least one of a visual display, a hard copy, and/or a tangible storage medium, as indicated the arrow out of the ROTC 126 in FIG. 3.

Figure 7:
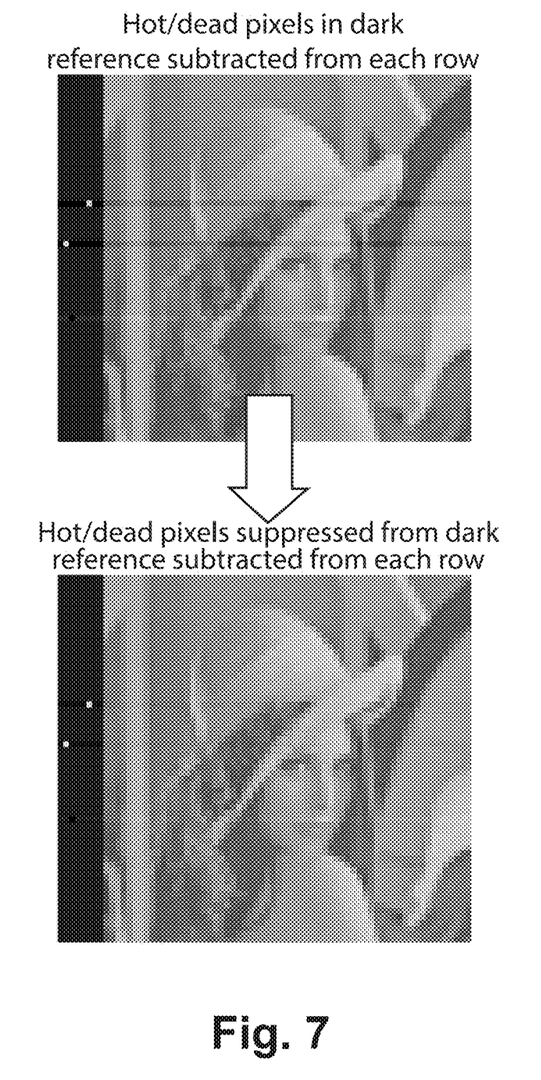
FIG. 7 is a diagram showing the "Lenna" image with hot and/or dead pixels in the dark reference, and showing the image that results from outlier suppression in the analog voting component of FIG. 3.

Usinge the methods above, for small BlkCol differences (small differences between inputs 116 of FIG. 4), vColRef (output 120 in FIG. 4) will settle to the average of the BlkCol inputs. Kirchoff's law states that the vColRef will settle to a voltage where the sum of all OTA output currents is zero. For larger differences between the BlkCol inputs, the OTA's current limiting feature should be accounted for as:

$$0 = \min(I_{LIM}, \max(-I_{LIM}, G_m^*(BlkCol<0> - vColRef)) + \min(I_{LIM}, \max(-I_{LIM}, G_m^*(BlkCol<1> - vColRef)) + \min(I_{LIM}, \max(-I_{LIM}, G_m^*(BlkCol<2> - vColRef)) + \min(I_{LIM}, \max(-I_{LIM}, G_m^*(BlkCol<3> - vColRef)),$$

where vColRef is the Column Reference Voltage, the average or voted average voltage of opaque reference columns (represented by the single output 120 in FIG. 3) that is subtracted from all live columns in the capacitive difference sampling circuit 110, and where the other variables are as described above and shown in FIG. 4. FIG. 7 shows the improvement in row noise reduction using this technique where hot/dead pixels are present in the dark reference. In case of one outlier column, the particular OTA 114 will enter ILIM current limiting. The output voltage (also $V_N$ on all OTAs 114) will settle to where the sum of currents is zero. The outlier will still have some effect on vColRef voltage, but the impact is significantly suppressed.

Additional potential benefits include that hot pixels are typically very noisy due to shot noise, but the noise gain from these suppressed pixels is virtually zero. This can make the difference between making the ROIC commercially viable, or having to discard it in quality control.

The methods and systems of the present disclosure, as described above and shown in the drawings, provide for improved row noise reduction in digital imaging devices. While the apparatus and methods of the subject disclosure have been shown and described, those skilled in the art will readily appreciate that changes and/or modifications may be made thereto without departing from the scope of the subject disclosure.

What is claimed is:

1. A method comprising:
   collecting analog image data from an imaging array wherein the analog image data includes analog image data from a plurality of imaging pixels and from a plurality of opaque pixels, wherein each row of the imaging array includes both imaging pixels and opaque pixels;
   performing opaque subtraction in an analog domain, wherein biases determined in the opaque pixels for a given row of the imaging array are subtracted from the analog image data of the imaging pixels of that given row for each row of the imaging array, wherein performing opaque subtraction includes suppressing outliers in the analog image data from the plurality of opaque pixels; and
   performing analog to digital conversion (ADC) on the analog image data to produce digital image data for the imaging pixels, wherein ADC is performed after opaque subtraction in the analog domain, wherein suppressing outliers includes clipping the analog image data from the plurality of opaque pixels prior to performing opaque subtraction to reduce impact on the digital image data of outliers in the opaque pixels, wherein clipping the analog image data from the plurality of opaque pixels includes using an operational transconductance amplifier (OTA) on the analog voltage data from the plurality of opaque pixels,
   wherein output current of the OTA is governed by $$I_{out} = \min(I_{LIM}, \max(-I_{LIM}, G_m^*(V_P - V_N)))$$

where $I_{out}$ is output current of the OTA, $I_{LIM}$ is limiting current for clipping outliers, $G_m$ is gain of the OTA, and $V_P - V_N$ differential input voltage of the OTA.

2. The method as recited in claim 1, wherein the limiting current for clipping outliers is governed by $$I_{LIM} \approx I_{biasN} * S_{105}/S_{104},$$

wherein $I_{LIM}$ is the limiting current for clipping outliers, $I_{biasN}$ is tail current of the OTA, and $S_{105}/S_{104}$ is current mirror gain of the OTA.

3. The method as recited in claim 1, wherein collecting analog image data includes feeding the analog image data from the plurality of opaque pixels on a column by column basis wherein the analog image data from each column of the opaque pixels is fed to a respective OTA, wherein there is one OTA per column of opaque pixels.

4. The method as recited in claim 1, wherein suppressing outliers in the analog image data from the plurality of opaque pixels includes suppressing analog image data from at least one of a dead pixel, a hot pixel, and/or a pixel with blinking response.

5. A method comprising:
   collecting analog image data from an imaging array wherein the analog image data includes analog image data from a plurality of imaging pixels and from a plurality of opaque pixels, wherein each row of the imaging array includes both imaging pixels and opaque pixels;
   performing opaque subtraction in an analog domain, wherein biases determined in the opaque pixels for a given row of the imaging array are subtracted from the analog image data of the imaging pixels of that given row for each row of the imaging array, wherein performing opaque subtraction includes suppressing outliers in the analog image data from the plurality of opaque pixels; and
   performing analog to digital conversion (ADC) on the analog image data to produce digital image data for the imaging pixels, wherein ADC is performed after opaque subtraction in the analog domain, wherein suppressing outliers includes clipping the analog image data from the plurality of opaque pixels prior to performing opaque subtraction to reduce impact on the digital image data of outliers in the opaque pixels, wherein clipping the analog image data from the plurality of opaque pixels includes using an operational transconductance amplifier (OTA) on the analog voltage data from the plurality of opaque pixels, wherein collecting analog image data includes feeding the analog image data from the plurality of opaque pixels on a column by column basis wherein the analog image data from each column of the opaque pixels is fed to a respective OTA, wherein there is one OTA per column of opaque pixels, wherein each OTA has a respective output, wherein suppressing outliers includes shorting the outputs of the OTAs together to average analog image data for rows of the opaque pixels, wherein outliers are suppressed by current limiting in the OTAs, wherein output current of the OTA is governed by $$I_{out} \approx \min(I_{LIM}, \max(-I_{LIM}, G_m*(V_P-V_N)))$$

where $I_{out}$ is output current of the OTA, $I_{LIM}$ is limiting current for clipping outliers, $G_m$ is gain of the OTA, and $V_p$-$V_n$ is differential input voltage of the OTA.

6. The method as recited in claim 5, further comprising using average analog image data for the rows, with outliers suppressed, to reduce row noise in the analog image data from the plurality of imaging pixels to create analog image data with reduced row noise.

7. The method as recited in claim 6, wherein performing ADC includes converting the analog image data with reduced row noise into digital image data.

8. The method as recited in claim 7, further comprising outputting the digital image data to at least one of a visual display, a hard copy, and/or a tangible storage medium.

9. A system comprising:
a pixel array including a sub array of imaging pixels and a sub-array of opaque pixels;
an analog voting component operatively connected to the sub-array of opaque pixels to receive analog image data from the sub-array of opaque pixels; and
a filtering component operatively connected to the sub-array of imaging pixels to receive analog image data from the sub-array of imaging pixels, and to the analog voting component for subtracting row averages from the sub-array of opaque pixels to reduce row noise in analog image data from the sub-array of imaging pixels, wherein the analog voting component is configured to suppress outliers in the row averages from the sub-array of the opaque pixels, wherein the analog voting component includes a respective operational transconductance amplifier (OTA) connected to each respective column of the sub-array of opaque pixels, wherein each OTA has a respective output, wherein suppressing outliers includes shorting the outputs of the OTAs together to average analog image data for rows of the opaque pixels, wherein outliers are suppressed by current limiting in the OTAs,
wherein output current of the OTA is governed by $$I_{out} \approx \min(I_{LIM}, \max(-I_{LIM}, G_m*(V_P-V_N)))$$

where $I_{out}$ is output current of the OTA, $I_{LIM}$ is limiting current for clipping outliers, $G_m$ is gain of the OTA, and $V_p$-$V_n$ is differential input voltage of the OTA.

10. The system as recited in claim 9, wherein outputs of each of the OTAs are shorted together to output row averages with outliers suppressed to the filtering component.

11. The system as recited in claim 9, further comprising an analog to digital conversion (ADC) component is operatively connected to receive analog image data from the filtering component for conversion into digital image data, wherein the ADC component resides in a read out only integrated circuit (ROIC) and wherein the pixel array, analog voting component, and the filtering component all reside in a focal plane array (FPA).

* * * * *